(12) United States Patent
Oh et al.

(10) Patent No.: US 11,152,523 B2
(45) Date of Patent: Oct. 19, 2021

(54) SOLAR CELL AND SOLAR CELL PANEL INCLUDING THE SAME

(71) Applicant: LG Electronics Inc., Seoul (KR)

(72) Inventors: Donghae Oh, Seoul (KR); Jinsung Kim, Seoul (KR); Haejong Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/141,661

(22) Filed: Sep. 25, 2018

(65) Prior Publication Data

US 2019/0097073 A1    Mar. 28, 2019

(30) Foreign Application Priority Data

Sep. 25, 2017  (KR) .................. 10-2017-0123626

(51) Int. Cl.
| | |
|---|---|
| *H01L 31/05* | (2014.01) |
| *H01L 31/042* | (2014.01) |
| *H01L 31/02* | (2006.01) |
| *H01L 31/0216* | (2014.01) |
| *H01L 31/0224* | (2006.01) |
| *H01L 31/0236* | (2006.01) |
| *H01L 31/048* | (2014.01) |

(52) U.S. Cl.
CPC ...... *H01L 31/0508* (2013.01); *H01L 31/0201* (2013.01); *H01L 31/02168* (2013.01); *H01L 31/02363* (2013.01); *H01L 31/022425* (2013.01); *H01L 31/042* (2013.01); *H01L 31/048* (2013.01); *H01L 31/0512* (2013.01)

(58) Field of Classification Search
CPC ............. H01L 31/0508; H01L 31/0201; H01L 31/02168; H01L 31/022425; H01L 31/02363; H01L 31/042; H01L 31/048; H01L 31/0512
See application file for complete search history.

(56) References Cited

U.S. PATENT DOCUMENTS

| | | | | | |
|---|---|---|---|---|---|
| 3,116,171 | A | * | 12/1963 | Leif ...................... | H02S 20/20 136/245 |
| 3,575,721 | A | * | 4/1971 | Mann .................. | H01L 31/0508 136/244 |
| 4,617,420 | A | * | 10/1986 | Dilts ..................... | H01L 31/042 136/244 |
| 4,617,421 | A | * | 10/1986 | Nath .................. | H01L 31/03921 136/244 |

(Continued)

FOREIGN PATENT DOCUMENTS

WO    WO-2014065016 A1 *  5/2014 ......... H01L 31/0508

*Primary Examiner* — Golam Mowla
(74) *Attorney, Agent, or Firm* — Fish & Richardson P.C.

(57) ABSTRACT

A solar cell that includes: a semiconductor substrate that has a length in a first direction and a width in a second direction, the second direction being different from the first direction; a first conductive region that is coupled to the semiconductor substrate; and a first electrode that is electrically connected to the first conductive region, wherein the first electrode comprises: a plurality of finger electrodes that extend in the first direction; and a connection electrode that extends in the second direction, that electrically connects two or more of the plurality of finger electrodes to each other, and that is separated from the first conductive region, and a solar cell panel including the solar cell are disclosed.

12 Claims, 11 Drawing Sheets

(56) References Cited

U.S. PATENT DOCUMENTS

| | | | | |
|---|---|---|---|---|
| 4,633,034 A | * | 12/1986 | Nath | H01L 31/076 |
| | | | | 136/256 |
| 4,652,693 A | * | 3/1987 | Bar-On | H01L 31/0201 |
| | | | | 136/244 |
| 2005/0263178 A1 | * | 12/2005 | Montello | H01L 25/047 |
| | | | | 136/244 |
| 2010/0170568 A1 | * | 7/2010 | Kawaguchi | C03C 3/064 |
| | | | | 136/256 |
| 2010/0243048 A1 | * | 9/2010 | Laudisio | C03C 8/16 |
| | | | | 136/256 |
| 2014/0124014 A1 | * | 5/2014 | Morad | H01L 31/048 |
| | | | | 136/246 |

* cited by examiner (a)          (b)

(a)  (b)

(a)  (b)

SOLAR CELL AND SOLAR CELL PANEL INCLUDING THE SAME

CROSS-REFERENCE TO RELATED APPLICATION

This application claims priority to and the benefit of Korean Patent Application No. 10-2017-0123626, filed in the Korean Intellectual Property Office on Sep. 25, 2017, the entire contents of which are incorporated herein by reference.

TECHNICAL FIELD

Embodiments of the invention relate to a solar cell and a solar cell panel including the same, and, more particularly, to a solar cell having an improved structure and a solar cell panel including the same.

BACKGROUND

Recently, as energy resources such as oil and coal are expected to be depleted, interest in alternative energy to replace them is increasing. Among them, solar cells are attracting attention as a next generation battery which converts solar energy into electric energy. Solar cells are manufactured by forming various layers and electrodes according to design. Since a solar cell is exposed to an external environment for a long time, it is manufactured in a form of a solar cell panel by a packaging process for protecting a solar cell.

Manufacturing cost, efficiency, and output of a solar cell or a solar cell panel may vary depending on a design of various layers and electrodes of the solar cell, a connection structure thereof, and the like. Accordingly, it is required to design a solar cell and a solar cell panel so as to reduce manufacturing cost and to improve efficiency and output.

SUMMARY

Therefore, embodiments of the invention have been made in view of the above problems, and embodiments of the invention are to provide a solar cell having enhanced efficiency and a solar cell panel having enhanced output.

In general, one innovative aspect of the subject matter described in this specification can be implemented in a solar cell panel, comprising: a plurality of solar cells comprising a first solar cell and a second solar cell, wherein an overlapped portion of the first solar cell overlaps with an overlapped portion of the second solar cell; and a connecting member that is located between the overlapped portion of the first solar cell and the overlapped portion of the second solar cell and that connects the first solar cell to the second solar cell, wherein at least one of the first solar cell or the second solar cell comprises: a semiconductor substrate that has a length in a first direction and a width in a second direction, the second direction being different from the first direction, a first conductive region that is coupled to the semiconductor substrate, and a first electrode that is electrically connected to the first conductive region, and wherein the first electrode of the first solar cell comprises: a plurality of finger electrodes that extend in the first direction, and a connection electrode that extends in the second direction, that electrically connects two or more of the plurality of finger electrodes to each other, and that is separated from the first conductive region.

The foregoing and other implementations can each optionally include one or more of the following features, alone or in combination. In particular, one implementation includes all the following features in combination. The plurality of finger electrodes comprise respective contact portions that are directly in contact with the first conductive region. At least one portion of the connection electrode is located at a non-overlapped portion of the first solar cell. The overlapped portion of the first solar cell is located at a first side of the first solar cell, and wherein a portion of the connection electrode of the first solar cell is located at a second side of the first solar cell, the first side being opposite to the second side relative to a center of the first solar cell. The connection electrode extends in the second direction and is respectively connected to the plurality of finger electrodes, the connected portions of the plurality of finger electrodes being located at the second side of the first solar cell. At least one portion of each of the plurality of finger electrodes is located on a surface of the connection electrode. At least one of the plurality of finger electrodes comprises: a contact portion that is directly in contact with the first conductive region and that does not overlap with the connection electrode, and a non-contact portion that is separated from the first conductive region and that overlaps with the connection electrode, wherein the connection electrode is located between the non-contact portion and the first conductive region. A width of the connection electrode is five times or less than a width of at least one of the plurality of finger electrodes. A thickness of the connection electrode is less than or equal to a thickness of at least one of the plurality of finger electrodes. Both the connection electrode and the plurality of finger electrodes include a particular conductive material, and wherein a glass frit of the connection electrode is different from a glass frit of the plurality of finger electrodes. Two adjacent finger electrodes of the plurality of finger electrodes are separated from each other, and wherein a portion of the connection electrode is located at a space between the two adjacent finger electrodes of the plurality of finger electrodes. The connecting member includes (i) a plurality of first connecting portions that are respectively connected to the plurality of finger electrodes and (ii) a plurality of second connecting portions that are coupled to an insulating layer, the insulating layer being located at the space between the two adjacent finger electrodes of the plurality of finger electrodes, and wherein the plurality of first connecting portions and the plurality of second connecting portions are alternately arranged in the second direction. The first solar cell comprises: a connecting portion that is electrically connected to an end of at least one of the plurality of finger electrodes and that has a length greater than a width of the at least one of the plurality of finger electrodes in the second direction, the end being located at the overlapped portion of the first solar cell. The first solar cell comprises: a second conductive region that is coupled to the semiconductor substrate, and a second electrode that is electrically connected to the second conductive region, wherein a surface of the second electrode is entirely in contact with the second conductive region.

In general, another innovative aspect of the subject matter described in this specification can be implemented in a solar cell, comprising: a semiconductor substrate that has a length in a first direction and a width in a second direction, the second direction being different from the first direction; a first conductive region that is coupled to the semiconductor substrate; and a first electrode that is electrically connected to the first conductive region, wherein the first electrode comprises: a plurality of finger electrodes that extend in the first direction; and a connection electrode that extends in the second direction, that electrically connects two or more of the plurality of finger electrodes to each other, and that is separated from the first conductive region.

The foregoing and other implementations can each optionally include one or more of the following features, alone or in combination. In particular, one implementation includes all the following features in combination. The plurality of finger electrodes comprise respective contact portions that are directly in contact with the first conductive region. The solar cell further includes: an overlapped portion that is overlapped with an adjacent solar cell, wherein at least one portion of the connection electrode is located at a non-overlapped portion of the solar cell. The plurality of finger electrodes comprise: a contact portion that is directly in contact with the first conductive region and that does not overlap with the connection electrode, and a non-contact portion that is separated from the first conductive region and that overlaps with the connection electrode, wherein the connection electrode is located between the non-contact portion and the first conductive region. A width of the connection electrode is five times or less than a width of at least one of the plurality of finger electrodes, and wherein a thickness of the connection electrode is less than or equal to a thickness of at least one of the plurality of finger electrodes. Both the connection electrode and the plurality of finger electrodes include a particular conductive material, and wherein a glass frit of the connection electrode is different from a glass frit of the plurality of finger electrodes.

According to an embodiment, by including a finger electrode, which is formed of a contact electrode, and a connection electrode, which is formed of a non-contact electrode and includes at least a portion spaced apart from an overlapped portion, a contact area between an electrode and a conductive region can be reduced and a carrier movement path can be sufficiently secured. Thus, open circuit voltage, a current density, and so on of the solar cell can be increased, efficiency of the solar cell can be improved, and output of the solar cell panel can be improved.

DETAILED DESCRIPTION

Figure 1:
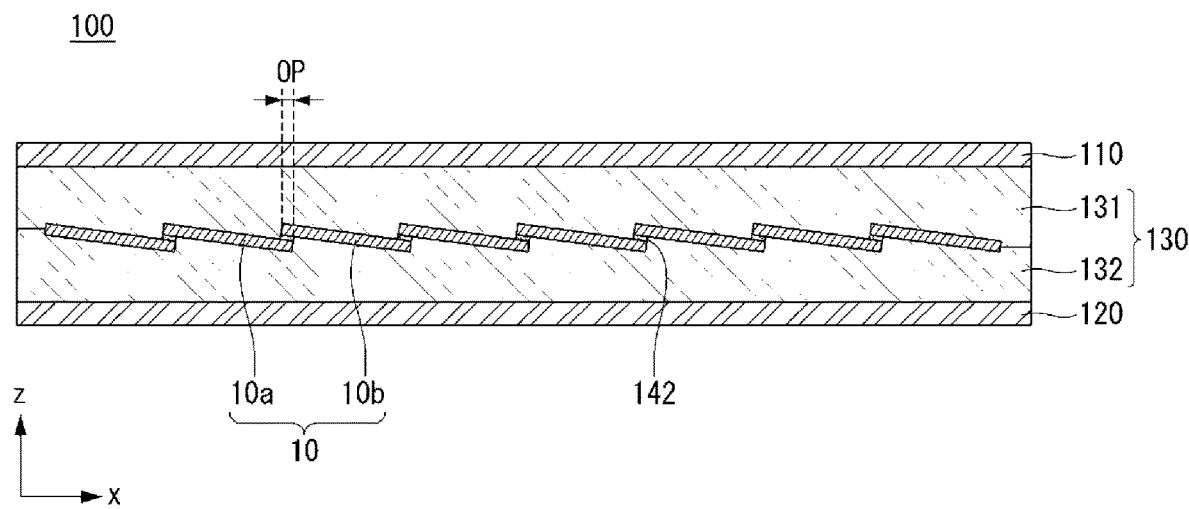
FIG. 1 is a cross-sectional view showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell panel and a solar cell included therein according to an embodiment of the invention will be described in detail with reference to the accompanying drawings.

Figure 2:
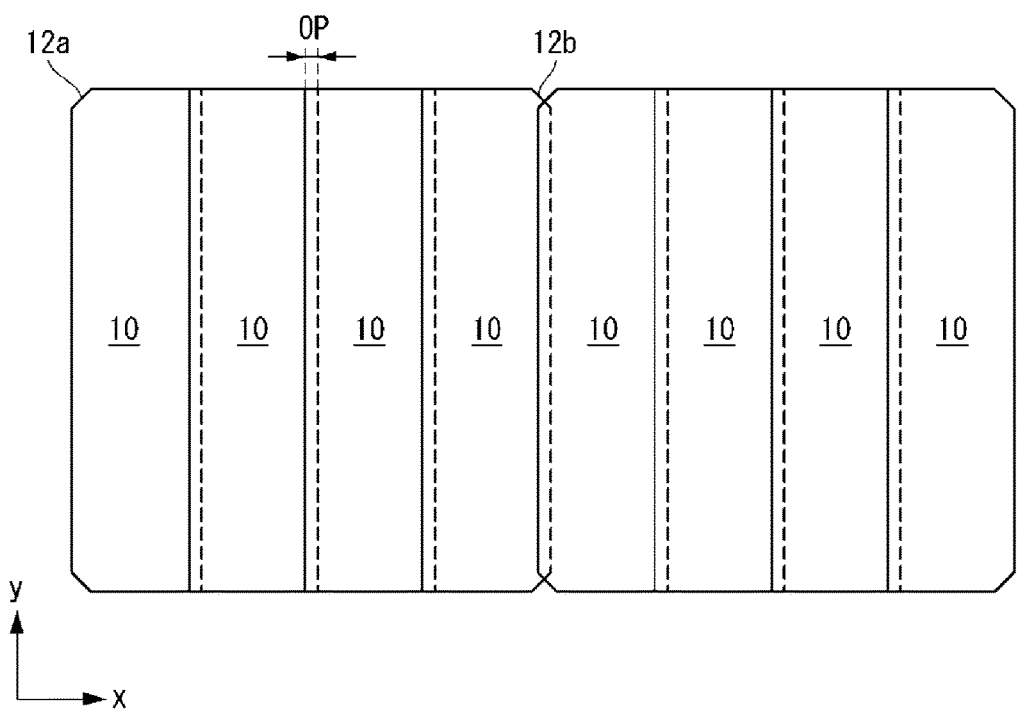
FIG. 2 is a plan view schematically showing a plurality of solar cells included in the solar cell panel shown in FIG. 1 and connected to each other by connecting members.
Figure 3:
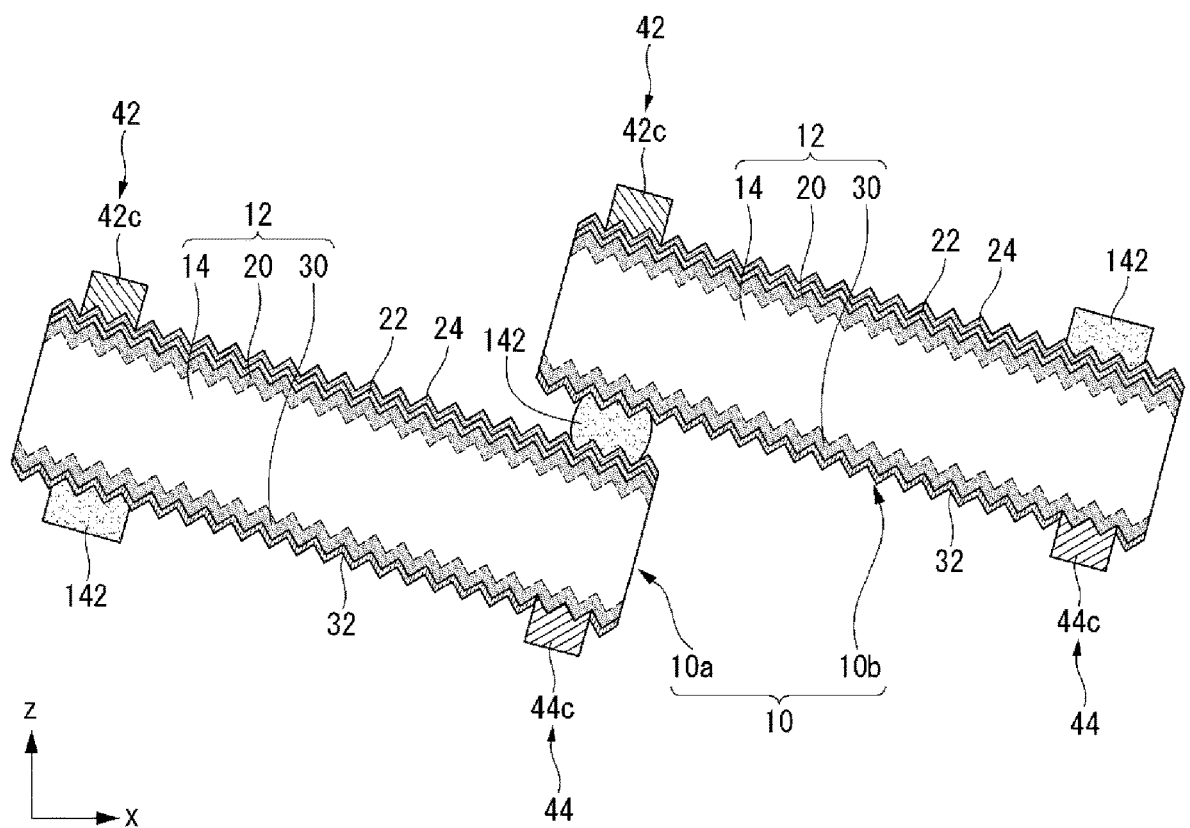
FIG. 3 is a cross-sectional view schematically showing two solar cells included in the solar cell panel shown in FIG. 1 and connected to each other by a connecting member.

FIG. 1 is a cross-sectional view showing a solar cell panel 100 according to an embodiment of the invention, and FIG. 2 is a plan view schematically showing a plurality of solar cells 10 included in the solar cell panel shown in FIG. 1 and connected to each other by connecting members 142. FIG. 3 is a cross-sectional view schematically showing two solar cells (e.g., a first solar cell 10a and a second solar cell 10b) included in the solar cell panel shown in FIG. 1 and connected to each other by a connecting member 142. In order to show clearly and simply, a first electrode 42 and a second electrode 44 and a connecting member 142 are not shown in FIG. 2.

Referring to FIGS. 1 to 3, a solar cell panel 100 according to the present embodiment includes a plurality of solar cells 10 including a first solar cell 10a and a second solar cell 10b, and a connecting member 142 positioned between the first and second solar cells 10a and 10b at an overlapped portion OP of the first and second solar cells 10a and 10b and connecting the first and second solar cells 10a and 10b. In this instance, the first and second solar cells 10a and 10b include a semiconductor substrate 12 having a length in a direction of a major axis (for example, a long axis or an y-axis) and a width of a direction of a minor axis (for example, a short axis or an x-axis), a first conductive region 20 formed at or on the semiconductor substrate 12, and a first electrode 42. The first electrode 42 includes a plurality of finger electrodes 42a (in FIG. 4) and a connection electrode 42c. This will be described in more detail later. The solar cell panel 100 may include a sealing member 130 that surrounds and seals the plurality of solar cells 10 and the connecting member 142, a first cover member 110 that is positioned on one side of the solar cell 10 on the sealing member 130, and a second cover member 120 positioned on the other side of the solar cell 10 on the sealing member 130. This will be described in more detail.

The first cover member 110 is disposed on the sealing member 130 (for example, a first sealing member 131) to constitute a surface (for example, a front surface) of the solar cell panel 100, and the cover member 120 is disposed on the sealing member 130 (for example, a second sealing member 132) to constitute the other surface (for example, a back surface) of the solar cell panel 100. Each of the first cover member 110 and the second cover member 120 may be formed of an insulating material capable of protecting the solar cell 10 from external shock, moisture, ultraviolet rays, or the like. The first cover member 110 may be formed of a light-transmitting material that can transmit light, and the second cover member 120 may be formed of a sheet of a light-transmitting material, a non-light-transmitting material, or a reflective material. For example, the first cover member 110 may be formed of a glass substrate having excellent durability and an excellent insulation property, and the second cover member 120 may be formed of a film or a sheet. The second cover member 120 may have a TPT (Tedlar/PET/Tedlar) type or may include a base film (for example, a polyethylene terephthalate (PET) film) and a polyvinylidene fluoride (PVDF) resin layer formed on at least one surface of the base film.

The sealing member 130 may include a first sealing member 131 positioned on a front surface of the solar cell 10 connected by the connecting member 142 and the second sealing member 131 positioned on a back surface of the solar cell 10 connected by the connecting member 142. The first sealing member 131 and the second sealing member 132 prevent moisture and oxygen from entering and chemically couple members of the solar cell panel 100. The first and second sealing members 131 and 132 may be formed of an insulating material having a light-transmitting property and an adhesive property. For example, an ethylene-vinyl acetate copolymer resin (EVA), a polyvinyl butyral, a silicone resin, an ester-based resin, an olefin-based resin, or the like may be used for the first sealing member 131 or the second sealing member 132. The second cover member 120, the second sealing member 132, the solar cells 10 connected by the connecting member 142, the first sealing member 131, and the first cover member 110 are integrated by a lamination process using the first and second sealing members 131 and 132 to form the solar cell panel 100.

However, embodiments of the invention are not limited thereto. Accordingly, the first and second sealing members 131 and 132, the first cover member 110, or the second cover member 120 may include any of various materials and may have any of various shapes, other than those described above. For example, the first cover member 110 or the second cover member 120 may have any of various forms or types (e.g., a substrate, film, sheet, etc.) or materials.

In the embodiment, the solar cell 10 may be formed by cutting a mother solar cell to have a major axis and a minor axis. That is, one mother solar cell is cut to manufacture a plurality of solar cells 10 having a major axis and a minor axis, and the cut solar cell 10 is used as a unit solar cell. When the solar cell panel 100 is manufactured by connecting the plurality of solar cells 10 that are formed by cutting, output loss of the solar cell panel 100 (that is, cell to module loss (CTM loss)) can be reduced.

The output loss cell of each solar cell 10 has a value obtained by multiplying a square of a current by an electric resistance, and the output loss of the solar cell panel 100 including the plurality of solar cells 10 has a total value obtained by multiplying the value, which is obtained by multiplying the square of the current by the electric resistance, by a number of solar cells 10. However, in the current of each solar cell 10, there is a current generated by an area of the solar cell 10 itself. Thus, the current becomes greater when the area of the solar cell 10 increases, while the current becomes smaller when the area of the solar cell 10 decreases.

Therefore, when the solar cell panel 100 includes the solar cells 10 manufactured by cutting the mother solar cell, the current of each solar cell 10 decreases in proportion to the area, but the number of the solar cell 10 increases inversely. For example, when there are four solar cells 10 manufactured from the mother solar cell, the current in each solar cell 10 is reduced to one quarter of the current of the mother solar cell, and the number of solar cells 10 is four times the number of mother solar cell. The current is reflected as a square and the number is reflected as it is, and thus, the output loss is reduced to a quarter. Accordingly, the output loss of the solar cell panel 100 according to the embodiment can be reduced.

In the embodiment, the mother solar cell is manufactured as in the conventional manner, and then, the solar cell 10 is formed by cutting the mother solar cell. According to this, the solar cell 10 can be manufactured by manufacturing the mother solar cell using a used equipment and optimized design as it is and then cutting the mother solar cell. As a result, a cost in equipment and process can be minimized. On the other hand, if an area of a solar cell or a mother solar cell itself is reduced, it is burdened to replace an equipment or change a setting (for example, process conditions, etc).

More specifically, the mother solar cell or a semiconductor substrate thereof may be manufactured from a roughly circular ingot and may have a circular shape, a square shape, or a shape where lengths in two directions (x-axis and y-axis directions in the drawings) are the same or very similar. For example, the semiconductor substrate of the mother solar cell may have an octagonal shape having inclined portions 12a and 12b at four corner portions at an approximate square shape. With such a shape, the semiconductor substrate having a maximum area can be obtained from the same ingot. For reference, four solar cells 10, which are adjacent to each other in order from the left side in FIG. 2, may be manufactured in one mother solar cell. However, embodiments of the invention are not limited thereto, and the number of solar cells 10 manufactured from one mother solar cell may be variously modified.

As described above, the mother solar cell has a symmetrical shape and a maximum lateral width (a width across a center of the semiconductor substrate) and a maximum vertical width (a length across a center of the semiconductor substrate) in the mother solar cell are the same.

The solar cell 10 formed by cutting such a mother solar cell along a cutting line extending in one direction (for example, the y-axis direction in the drawing) may have a major axis and a minor axis. The plurality of solar cells 10 manufactured in the above may be electrically connected to each other by using the connecting member 142.

For example, in the embodiment, one side portion of the solar cell 10 (that is, the first solar cell 10a) among the plurality of solar cells 10 overlaps the other side portion of the solar cell 10 (e.g., the second solar cell 10b) adjacent to the first solar cell 10a among the plurality of solar cells 10 to form an overlapped portion OP. The overlapped portion OP may extend along a direction parallel to the major axis of the solar cell 10. The connecting member 142 is positioned between the electrodes 42 and 44 of two adjacent solar cells 10 at the overlapped portion OP to electrically connect the two adjacent solar cells 10. Then, the solar cells 10 having the minor axis and the major axis are connected in the direction parallel to the major axis, and a connection area can be sufficiently secured to stably connect the solar cells 10.

The connection member 142 may include an adhesive material. As the adhesive material, any of various materials capable of electrically and physically connecting the two solar cells 10 with an electrical conductivity and an adhesive property may be used. For example, the connection member 142 may be formed of an electrical conductive adhesive (ECA), a solder, or the like.

The plurality of solar cells 10 may be electrically connected in series, parallel, or series-parallel by the connecting member 142. As described above, the connection structures of the neighboring first and second solar cells 10a and 10b may be successively repeated in two adjacent solar cells 10 and thus a plurality of solar cells 10 may be connected in series, thereby forming a solar cell string composed of a row. Such a solar cell string may be formed by various methods or apparatuses.

The first cover member 110, the first sealing member 131, the plurality of solar cells 10 by the connecting members 142 (that is, the solar cell string), the second sealing member 132, and the second cover member 120 may be sequentially disposed to form a laminate structure, and then, a lamination process of applying heat and pressure to the laminate structure may be performed. Thereby, the solar cell panel 100 is manufactured.

Hereinafter, a structure of each solar cell 10 will be described in more detail with reference to FIG. 3.

Referring to FIG. 3, the solar cell 10 according to the embodiment includes a semiconductor substrate 12, conductive regions 20 and 30 formed at or on the semiconductor substrate 12, and electrodes 42 and 44 connected to the conductive regions 20 and 30, respectively. That is, the solar cell 10 according to the embodiment may be a crystalline semiconductor solar cell based on the semiconductor substrate 12. For example, the conductive regions 20 and 30 may include a first conductive region 20 and a second conductive region 30 having different conductivity types, and the electrodes 42 and 44 may include a first electrode 42 connected to the conductive region 20 and a second electrode 44 connected to the second conductive region 30.

The semiconductor substrate 12 may include a base region 14 including a first or second conductivity type dopant to have a first or second conductivity type at a relatively low doping concentration. In one example, the base region 14 may have a second conductivity type. The base region 14 may be formed of a single-material crystalline semiconductor (e.g., a single-material single-crystalline or polycrystalline semiconductor, such as, single-crystalline or polycrystalline silicon, more particularly, single-crystalline silicon) including the first or second conductivity type dopant. The solar cell 10 based on the base region 14 or the semiconductor substrate 12 having a high degree of crystallinity and having few defects is excellent in electrical property. In this instance, at least one of a front surface and a back surface of the semiconductor substrate 12 may be provided with a texturing structure or an anti-reflection structure having a concavo-convex shape (or an uneven shape, an protruded and/or indented shape, or so on) such as a pyramid to minimize reflection.

The conductive regions 20 and 30 may include the first conductive region 20 having the first conductivity type and positioned on one surface (for example, the front surface) of the semiconductor substrate 12 and the second conductive region 30 having the second conductivity type and positioned on the other surface (e.g., the back surface) of the semiconductor substrate 12. The conductive regions 20 and 30 may have a conductivity type different than that of the base region 14 or may have a higher doping concentration than the base region 14. In the embodiment, the first and second conductive regions 20 and 30 are formed of a doped region constituting a part of the semiconductor substrate 12, and thus, a junction property with the base region 14 can be improved. In this instance, the first conductive region 20 or the second conductive region 30 may have a homogeneous structure, a selective structure, or a local structure.

However, embodiments of the invention are not limited thereto, and at least one of the first and second conductive regions 20 and 30 may be formed separately from the semiconductor substrate 12 on the semiconductor substrate 12. In this instance, the first or second conductive region 20 or 30 may be formed of a semiconductor layer (for example, an amorphous semiconductor layer, a microcrystalline semiconductor layer, or polycrystalline semiconductor layer, for example, an amorphous silicon layer, a microcrystalline silicon layer, or polycrystalline silicon layer) having a crystal structure different from that of the semiconductor substrate 12. Then, the first or second conductive region 20 or 30 can be easily formed on the semiconductor substrate 12.

One region of the first and second conductive regions 20 and 30, which has a conductivity type different from that of the base region 14, constitutes at least a part of an emitter region. The other region of the first and second conductive regions 20 and 30, which has a conductivity type the same as that of the base region 14, constitutes at least a part of a surface field region. For example, in the embodiment, the base region 14 and the second conductive region 30 may have an n-type as the second conductivity type, and the first conductive region 20 may have a p-type. Then, the base region 14 and the first conductive region 20 form a pn junction. When light is incident to the pn junction, electrons generated by a photoelectric effect move toward the back surface of the semiconductor substrate 12 and are collected by the second electrode 44, and holes move toward the front surface of the semiconductor substrate 12 and are collected by the first electrode 42, thereby generating electric energy. Then, holes having a slower moving speed than electrons may move to the front surface of the semiconductor substrate 12, not the back surface thereof, thereby improving efficiency. However, embodiments of the invention are not limited thereto. Thus, the base region 14 and the second conductive region 30 may have a p-type and the first conductive region 20 may have an n-type. The base region 14 may have the conductivity type the same as that of the first conductive region 20 and opposite to that of the second conductive region 30.

In this instance, as the first or second conductivity type dopant, any of various materials which represent n-type or p-type may be used. As the p-type dopant, a group III element such as boron (B), aluminum (Al), gallium (Ga), or indium (In) may be used. As the n-type, a group V element such as phosphorus (P), arsenic (As), bismuth (Bi), or antimony (Sb) may be used. For example, the p-type dopant may be boron (B) and the n-type dopant may be phosphorus (P).

A first passivation layer 22 and/or an anti-reflection layer 24, which is a first insulating layer 22, may be formed on (e.g., in contact with) the front surface of the semiconductor substrate 12 (more particularly, the first conductive region 20 formed at the front surface of the semiconductor substrate 12). A second passivation layer 32, which is a second insulating layer, may be formed on (e.g., in contact with) the back surface of the semiconductor substrate 12 (more particularly, the second conductive region 30 formed at the back surface of the semiconductor substrate 12). The first passivation layer 22, the anti-reflection layer 24, and the second passivation layer 32 may be formed of any of various insulating materials. For example, the first passivation layer 22, the anti-reflection layer 24, or the second passivation layer 32 may be formed of a single layer or have a multi-layered structure in which two or more layer are included. The single layer or the multi-layered structure may include at least one of a silicon nitride film, a silicon nitride film including hydrogen, a silicon oxide film, a silicon oxynitride film, an aluminum oxide film, a silicon carbide film, ZnS, $TiO_2$, and $CeO_2$. However, embodiments of the invention are not limited thereto.

The first electrode 42 is electrically connected to the first conductive region 20 through an opening penetrating through the first insulating layer and the second electrode 44 is electrically connected to the first conductive region 20 through an opening penetrating through the second insulating layer. The first and second electrodes 42 and 44 are formed of any of various conductive materials (e.g., a metal) and may have any of various shapes. The shapes of the first and second electrodes 42 and 44 will be described in more detail with reference to FIG. 4 and FIG. 5, along with FIG. 3.

Figure 4:
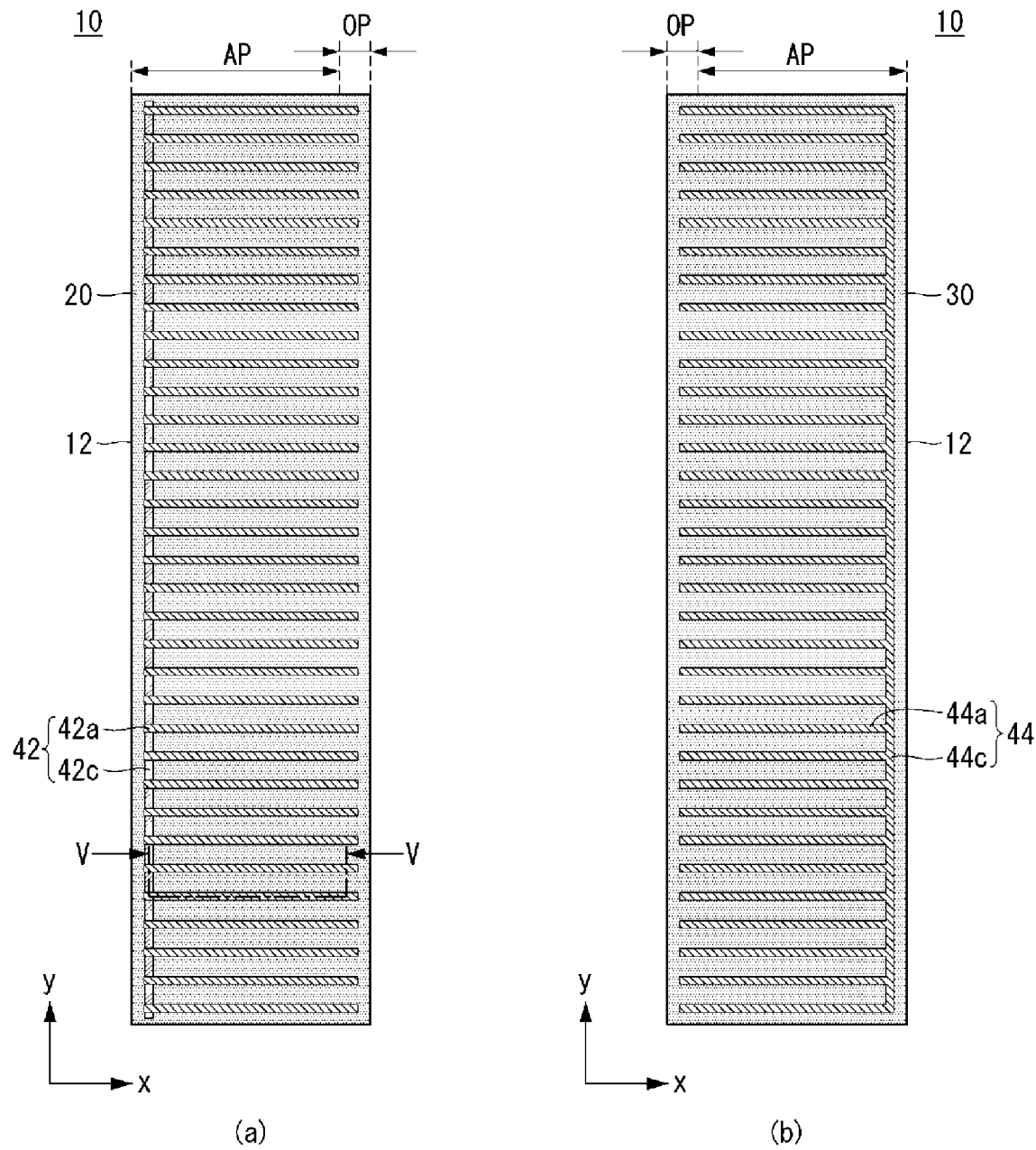
FIG. 4 is a front plan view and a rear plan view showing an example of a solar cell included in the solar cell panel shown in FIG. 1.
Figure 5:
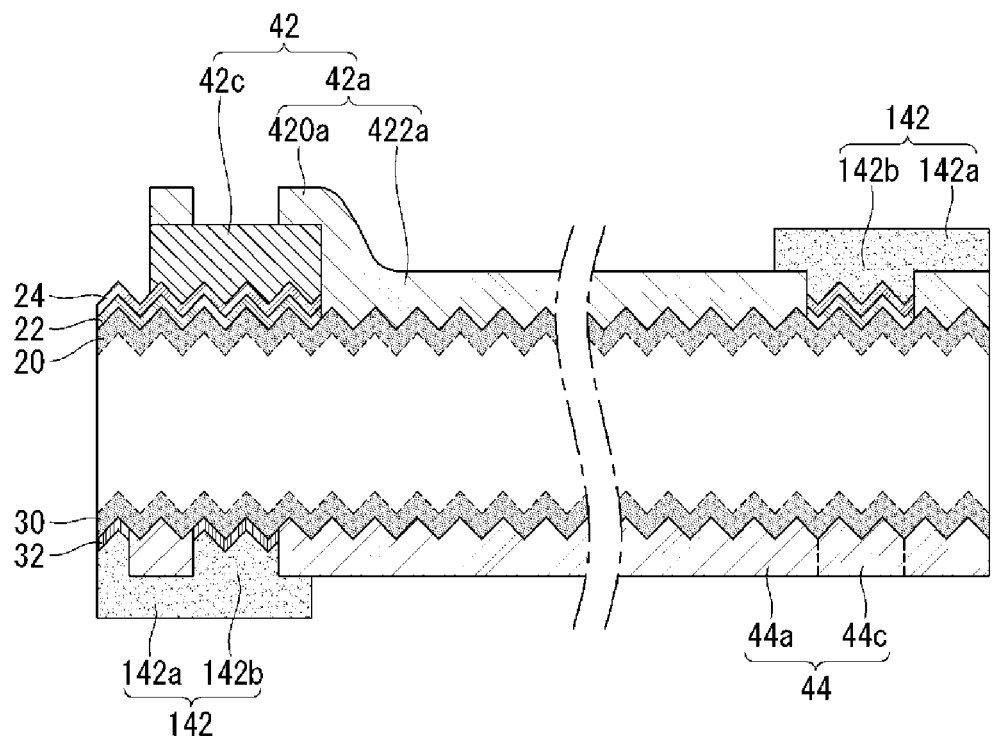
FIG. 5 is a cross-sectional view taken along V-V line of FIG. 4.

FIG. 4 is a front plan view and a rear plan view showing an example of the solar cell 10 included in the solar cell panel 100 shown in FIG. 1. FIG. 5 is a cross-sectional view taken along V-V line of FIG. 4. The connecting member 142 is not shown in FIG. 4 for simplicity while the connecting member 142 is shown in FIG. 5 for clear understanding.

Referring to FIGS. 4 and 5, the first electrode 42 may include a plurality of finger electrodes 42a formed in a first direction (an x-axis direction in the drawing). In this instance, at least a part of the plurality of finger electrodes 42a may include a contact portion 422a in direct contact with the first conductive region 20. The contact portion 422a collects carriers generated by a photoelectric conversion from the first conductive region 20. For example, the plurality of finger electrodes 42a may be spaced apart from each other to be parallel to each other and to have a constant or uniform pitch. In FIG. 4, it is exemplified that the finger electrodes 42a extend in a direction parallel to the minor axis, are parallel to each other, and are parallel to one edge of the semiconductor substrate 12.

The first electrode 42 may include a connection electrode 42c formed of a material or having a composition different from a material or a composition of the finger electrode 42a. The connection electrode 42c is formed in a second direction (a y-axis direction in the drawing) crossing the first direction to connect at least part of the plurality of finger electrodes 42a, and is spaced apart from the first conductive region 20. When at least a part of the plurality of finger electrodes 42a are connected by the connection electrode 42c, carriers can be transferred through the connection electrode 42c even if there is a problem such that some of the finger electrodes 42a are damaged or peeled off. That is, the connection electrode 42c may provide a kind of a bypass path for carriers. At least a part of the plurality of finger electrodes 42a may be connected by one connection electrode 42c. All of the plurality of finger electrodes 42a may be connected by one finger electrode 42c or a plurality of finger electrodes 42a.

In the case where an electrode connecting the plurality of finger electrodes 42a is not provided at the overlapped portion OP as in the present embodiment, the effect of the connection electrode 42c providing the bypass path can be further enhanced. In this specification, whether or not the electrode is positioned at the overlapped portion OP is determined on a basis that the portion where the connecting member 142 is positioned on the surface on which the electrode is positioned is the overlapped portion OP.

In this instance, the finger electrode 42a should have an excellent electrical contact property with the semiconductor substrate 12 or the first conductive region 20 in order to collect the carriers effectively. On the other hand, since the connection electrode 42c is electrically connected to the finger electrode 42a only to provide a bypass path for the carriers, the connection electrode 42c does not have to directly collect carriers from the semiconductor substrate 12 or the first conductive region 20. Accordingly, in the present embodiment, the finger electrode 42a is formed of a contact electrode, and the connection electrode 42c is formed of a non-contact electrode spaced apart from the first conductive region 20. The first insulating layer may be interposed between the connection electrode 42c and the first conductive region 20. The term of "the contact electrode" may include an electrode in which only a part is in contact with the first conductive region 20 and the other part is not in contact with the first conductive region 20, along with an electrode in which an entire portion is contact with the first conductive region 20.

If the connection electrode 42c is not in contact with the first conductive region 20, an area of the first electrode 42 contacting the first conductive region 20 can be minimized. This can minimize deterioration of a passivation property that may generate at a portion where the first conductive region 20 and the first electrode 42 are in contact with each other. Thus, open voltage of the solar cell 10 can be improved and thus efficiency of the solar cell 100 can be enhanced. An appearance or aesthetics of the solar cell 10 can be enhanced by the shape of the connection electrode 42c.

In this instance, since the connection electrode 42c only needs to provide the bypass path for carriers, the connection electrode 42c may have a small width so as to reduce optical loss. For example, a width of the connection electrode 42c may be five times or fewer (for example, three times or fewer, for example, 0.5 to 2 times) a width of the finger electrode 42a. Alternatively, the width of the connection electrode 42c may be 1 mm or less (for example, 500 μm or less, for example, 30 μm to 200 μm). This is for minimizing optical loss while stably providing a bypass path of the carrier, but embodiments of the invention are not limited thereto.

A thickness of the connection electrode 42c may be the same as or smaller than a thickness of the finger electrode 42a. In particular, the thickness of the connection electrode 42c may be smaller than the thickness of the finger electrode 42a. The thickness of the finger electrode 42a directly involved in the collection of the carriers is relatively increased to reduce the resistance and the thickness of the connection electrode 42c to provide only the bypass path is relatively decreased to reduce a material cost of the first electrode 42. For example, the thickness of the finger electrode 42a may be about 30 μm or less (for example, about 10 μm to 30 μm) and the thickness of the connection electrode 42c may be about 15 μm or less (for example, about 5 μm to 15 μm). In this thickness, the material cost of the first electrode 42 may be reduced while the finger electrode 42a has a low resistance. However, embodiments of the invention are not limited thereto.

In order to form the finger electrode 42a as the contact electrode and the connection electrode 42c as a non-contact electrode as described above, the finger electrode 42a and the connection electrode 42c may have different materials or compositions. That is, the connection electrode 42c may be positioned on the first insulating layer without penetrating the first insulating layer. Accordingly, the finger electrode 42a may have a material or composition that can penetrate the first insulating layer, and the connection electrode 42c may have a material or composition that does not penetrate the first insulating layer.

For example, the finger electrode 42a and the connection electrode 42c having predetermined patterns may be formed by performing a firing heat-treatment after printing pastes. Then, the finger electrode 42a and the connection electrode 42c having patterns can be easily formed by a simple process. In this instance, the finger electrode 42a or a first paste for forming the finger electrode 42a may have a material or composition that induces fire-through that the finger electrode 42a penetrates through the first insulating layer during the heat treatment, and the connection electrode 42c or a second paste for forming the connection electrode 42c may have a material or composition that does not induce fire-through during the heat treatment. In this case, openings may be formed by the heat treatment of the first paste without a process of separately forming the openings at the first insulating layer.

For example, the first paste for forming the finger electrode 42a or the second paste for forming the connection electrode 42c may include a conductive powder (more specifically, a metal powder), a glass frit, an organic binder, a solvent, and the like. In addition, the first and second pastes may further contain various additives such as a dispersing agent, a thixotropic agent and the like. During the heat treatment, most of the organic binder, solvent, and the like are removed, and the conductive powder, the glass frit, and the like may remain in the finger electrode 42a and the connection electrode 42c.

For example, the finger electrode 42a and the connection electrode 42c may include the same conductive material (for example, the same metal, for example, silver (Ag)) to have the same or similar properties. Thus, a problem due to the different materials can be prevented. In this instance, the glass frit of the finger electrode 42a or the first paste may include a material being able to induce the fire-through, and the glass frit of the connection electrode 42c or the second paste may include a material that does not induce the fire-through, unlike the glass frit of the finger electrode 42a.

As an example, an amount of lead (Pb) or bismuth (Bi) in the finger electrode 42a may be greater than an amount of lead or bismuth in the connection electrode 42c. In this instance, lead or bismuth is added in a form of lead oxide or bismuth oxide as a part of the glass frit contained in the first or second paste. Such lead oxide or bismuth oxide is a substance contributing to forming an opening through the first insulating layer by fire-through during the firing of the first paste. Accordingly, the first paste for forming the finger electrode 42a for forming the opening may include a relatively large amount of lead oxide or bismuth oxide so that the fire-through can be smoothly formed, and the connection electrode 42c may include a relatively small amount of lead oxide or bismuth oxide. Accordingly, an amount of lead or bismuth of the finger electrode 42a may be greater than an amount of lead or bismuth of the connection electrode 42c. However, embodiments of the invention are not limited thereto, and a kind and an amount of the glass frit, the lead, etc. may be variously changed.

An amount of the conductive material of the connection electrode 42c may be smaller than an amount of the conductive material of the finger electrode 42a. Since the finger electrode 42a directly contacts the first conductive region 20 to collect carriers, the amount of the conductive material may be relatively large to secure electrical properties. Since the connection electrode 42c only needs to provide a bypass path, the material cost can be reduced by reducing the amount of the conductive material since a burden due to an increase in resistance is not large.

In the above description, it is exemplified that the printing is used, but embodiments of the invention are not limited thereto. Therefore, the finger electrode 42a and the connection electrode 42c may be formed by different processes. That is, the finger electrode 42a may be formed by a printing process, and the connection electrode 42c may be formed by a plating process, a sputtering process, a deposition process, or the like. Then, an amount of the conductive material of the connection electrode 42c formed of a substantially pure conductive material may be greater than an amount of the conductive material of the finger electrode 42a formed by firing the first paste including the glass frit, the organic vehicle, and the like. Alternatively, the opening may be formed by a separate process other than the firing process. Then, an amount of lead or bismuth of the finger electrode 42a and the connection electrode 42c may not be particularly limited, since the finger electrode 42a may not include a material for the fire-through or may include the material for the fire-through with a small amount. Various other modifications are possible, and accordingly, a material, a composition, etc. of the finger electrode 42a and the connection electrode 42c may be variously modified.

As described above, the contact portion 422a of the finger electrode 42a is in contact with the first conductive region 20 by penetrating through the first insulating layer, and the connection electrode 42c is formed on the first insulating layer. In this instance, in the embodiment, the connection electrode 42c may be formed before forming the finger electrode 42a, and then, a part of the plurality of finger electrodes 42a may be positioned on the connection electrode 42c. That is, each of the plurality of finger electrodes 42a may include a non-contact portion 420a spaced apart from the first conductive region 20 with the first insulating layer and the connection electrode 42c therebetween at a portion where the finger electrode 42a and the connection electrode 42c overlap each other.

More specifically, in the present embodiment, the second paste for forming the connection electrode 42c is first printed and dried, and the first paste for forming the finger electrode 42a is printed, and then, the first paste and the second paste are subjected to a heat treatment for firing together, thereby forming the first electrode 42. This prevents a shape of the finger electrode 42a from undesirably changing or the finger electrode 42a from being undesirably spread or collapsed during the manufacturing process. On the contrary, if the first paste for forming the finger electrode 42a is first printed and dried, and the second paste for forming the connection electrode 42c is printed, and then, the first paste and the second paste are subjected to a heat treatment for firing together, the finger electrode 42a having a small width may be widely spread or be collapsed at a portion where the connection electrode 42c is formed during the process of forming the second paste. This problem may be more serious when the thickness of the finger electrode 42a is the same as or greater than the thickness of the connection electrode 42c as described above.

For example, in the present embodiment, a bus bar electrode connecting the plurality of finger electrodes 42a does not exist in the overlapped portion OP. Then, a plurality of finger electrodes 42a may be spaced apart from each other in the overlapped portion OP where the connecting member 142 is positioned. Accordingly, the connecting member 142 may include a first connecting portion 142a that is connected (e.g., contacted or attached) to the plurality of finger electrodes 42a (or the first electrodes 42), and a second connecting portion 142b that is positioned on (e.g., coupled to or attached to) the first insulating layer at portions between the plurality of finger electrodes 42a (or the first electrodes 42). More specifically, the first connecting portion 142a may include a plurality of first connecting portions 142a to correspond to the plurality of finger electrodes 42a one-to-one, and the second connecting portion 142b may include a plurality of second connecting portions 142b to correspond to a plurality of portions between the plurality of finger electrodes 42a one-to-one. In this instance, the first connecting portion 142a and the second connecting portion 142b of the connecting member 142 are alternately positioned one by one in a direction parallel to the major axis.

The connection electrode 42c may include a portion positioned at a region (for example, an effective portion or a non-overlapped portion AP) other than the connecting member 142 or the overlapped portion OP for connection with another solar cell 10. That is, the connection electrode 42c may include a portion spaced apart from the overlapped portion OP (for example, a portion positioned at a distance of 1 mm or more from the overlapped portion OP). As one example, the connection electrode 42c may include a portion apart from one side of the solar cell where the overlapped portion OP is positioned by 0.5 times a total width W of the solar cell 10 in a direction parallel to the minor axis, and thus, the connection electrode 42c may include a portion positioned at the other side opposite to the one side where the overlapped portion OP is positioned. Then, one sides of the finger electrodes 42a spaced apart from each other are electrically connected by the connecting member 142 and the other sides of the finger electrodes 42a spaced apart from each other are electrically connected by the connection electrode 42c, and thereby effectively providing a movement path for carriers. In the embodiment, it is exemplified that one connection electrode 42c connects all of the plurality of finger electrodes 42a, thereby minimizing an area of the connection electrode 42c and providing a stable bypass path. In particular, one connection electrode 42c may extend in a direction parallel to the major axis and perpendicular to the first direction so as to connect ends of the plurality of finger electrodes 42a positioned at the other side opposite to the overlapped portion OP, thereby minimizing optical loss.

An adhesive force between the first insulating layer and the connecting member 142 may be similar to an adhesive force between the first electrode 42a directly contacting the first conductive region 20 (that is, the contact portion 422a of the finger electrode 42a) and the connecting member 142. However, the adhesion force between an electrode not directly contacting the first conductive region 20 and the first insulating layer is lower than the above adhesive forces. Accordingly, when a bus bar electrode or the like which is not in direct contact with the first conductive region 20 is positioned in the overlapped portion OP and the connecting member 142 is connected to the bus bar electrode, the bus bar electrode may be separated from the first insulating layer by the low adhesive force. Thus, the connection of the first and second solar cells 10a and 10b using the connecting member 142 may not have good properties. In consideration of this, in the embodiment, the non-contact is not provided in the overlapped portion OP, while the connection electrode 42c, which is formed of a non-contact electrode, is provided at a portion spaced apart from the overlapped portion OP so as to provide a bypass path of the carrier.

Similarly, the second electrode 44 may include a plurality of finger electrodes 44a formed in the first direction. In this instance, at least a part of the plurality of finger electrodes 44a may include a contact portion in direct contact with the second conductive region 30, and thus, the contact portion collect carriers generated by the photoelectric conversion from the second conductive region 30. For example, the plurality of finger electrodes 44a may be spaced apart from each other so as to extend in parallel to each other and have a constant pitch. In FIG. 4, it is exemplified that the finger electrodes 44a extend in a direction parallel to the minor axis, are parallel to each other, and are parallel to one edge of the semiconductor substrate 12. The second electrode 44 may include a connection electrode 44c formed in the second direction crossing the first direction and connecting at least a part of the plurality of finger electrodes 44a.

The description of the first electrode 42 may be applied to the second electrode 44 as it is and the description of the first insulating layer with respect to the first electrode 42 may be applied to the second insulating layer with respect to the second electrode 44 as it is, if there is no other description. A width or a pitch of the finger electrode 42a and the connection electrode 42c of the first electrode 42 may be the same as or different from a width or a pitch of the finger electrode 44a and the connection electrode 44c of the second electrode 44.

For example, in the embodiment, the finger electrode 44a and the connection electrode 44c of the second electrode 44 may penetrate through the second insulating layer (for example, the second passivation layer 32) and be in contact with the second conductive region 30. That is, the finger electrode 44a and the connection electrode 44c of the second electrode 44 may be formed of contact electrodes being in contact with the second conductive region 30 as a whole, and may not include non-contact electrodes or non-contact portions. In a conductive region which is formed on the back surface of the semiconductor substrate 12 where light is relatively less incident and/or has a conductivity type the same as the base region 14, a problem due to passivation property degradation by the contact electrodes may be relatively small. In consideration of this, the second electrode 44 may be formed of a contact electrode as a whole to reduce a material cost and to simplify a process, thereby improving the productivity.

However, embodiments of the invention are not limited thereto. Thus, similarly to the first electrode 42, the finger electrode 44a of the second electrode 44 may be a contact electrode and the connection electrode 44c may be a non-contact electrode. In addition, the second electrode 44 may have a shape different from that of the first electrode 42, and various other modifications are possible.

In the embodiment, it is exemplified that one connection electrode 42c of the first electrode 42 is provided adjacent to one side (a left side in the drawing) of the finger electrode 42a of the first electrode 42 and one connection electrode 44c of the second electrode 44 is provided at the other side (a right side in the drawing) of the finger electrode 44a of the second electrode 44. More specifically, it is exemplified that the connection electrode 42c of the first electrode 42 longitudinally extends along a direction parallel to the major axis (for example, an y-axis direction of the drawing) of the semiconductor substrate 12 at a portion adjacent to one side in the minor axis of the semiconductor substrate 12, the connection electrode 44c of the second electrode 44 longitudinally extends along the direction parallel to the major axis of the semiconductor substrate 12 at a portion adjacent to the other side in the minor axis of the semiconductor substrate 12, and the first and second electrodes 42 and 44 are symmetrical to each other in the direction parallel to the minor axis. Thus, the bypass path can be stably formed in the first and second electrodes 42 and 44, respectively. However, embodiments of the invention are not limited thereto, and positions and shapes of the first and second electrodes 42 and 44 may be different from each other. Therefore, unlike the above, planar shapes of the first electrode 42 and the second electrode 44 are completely different from each other or have no similarity, and various other modifications are possible.

According to the embodiment, the first electrode 42 includes the finger electrode 42a, which is formed of the contact electrode, and the connection electrode 42c, which is formed of the non-contact electrode and includes at least a portion space apart from the overlapped portion OP, a contact area between the first electrode 42 and the first conductive region 20 can be reduced and a carrier movement path can be sufficiently secured. Thus, open circuit voltage, current density, and so on of the solar cell 10 can be increased, efficiency of the solar cell 10 can be improved, and output of the solar cell panel 100 can be improved.

Hereinafter, solar cell panels according to other embodiments of the invention will be described in detail. The detailed description will be omitted for the same or extremely similar parts as the above description, and only the different parts will be described in detail. Embodiments of the invention may include embodiments in which the above-described embodiments or modifications thereof are combined with the following embodiments or modifications thereof. Although a first electrode 42 is described below as an example, structures described later may be applied to at least one of a first electrode 42 and a second electrode 44.

Figure 6:
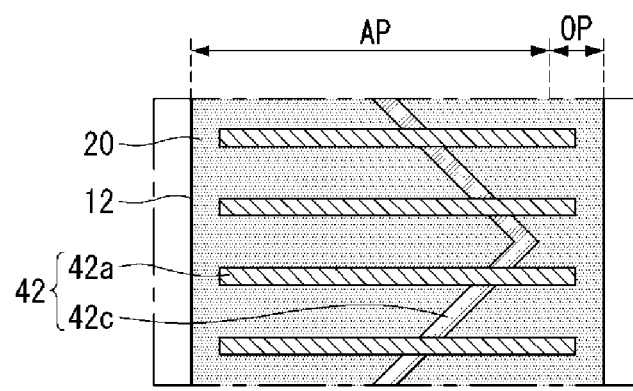
FIG. 6 is a front partial plan view showing an example of a solar cell included in a solar cell panel according to another embodiment of the invention.

FIG. 6 is a front partial plan view showing an example of a solar cell included in a solar cell panel according to another embodiment of the invention.

Referring to FIG. 6, in the embodiment, a connection electrode 42c of a first electrode 42 may include an inclined portion inclined to a finger electrode 42a. For example, the connection electrode 42c may include one inclined portion in one direction inclined to the finger electrode 42a and another inclined portion in another direction inclined to the finger electrode 42a and different from the one inclined portion to include a portion having a V shape. According to this, even in a direction of a minor axis, the connection electrode 42c can be evenly or uniformed distributed to the finger electrode 42a, and a bypass path of carriers can be effectively formed.

Figure 7:
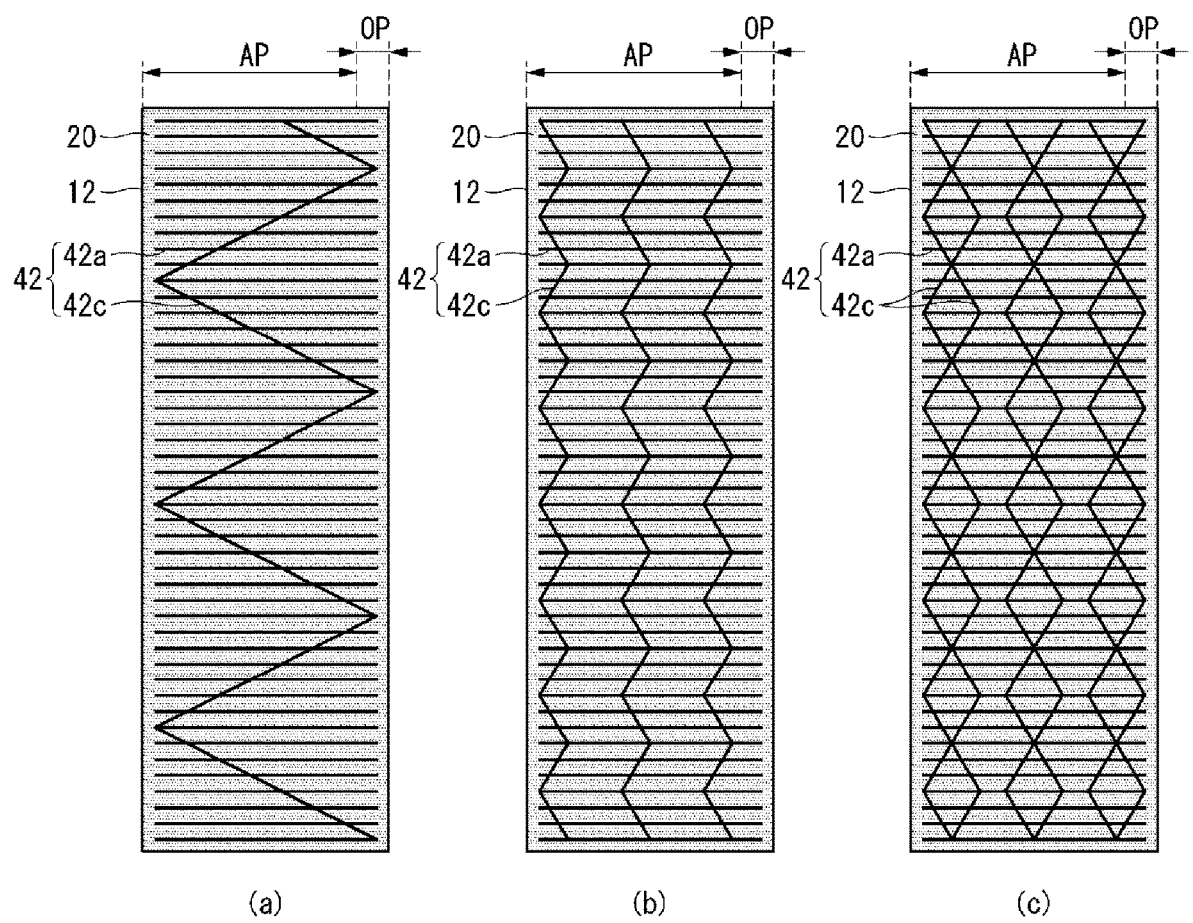
FIG. 7 is front plan views schematically showing solar cells according to various modified embodiments of the invention.

FIG. 7 is front plan views schematically showing solar cells according to various modified embodiments of the invention. In FIG. 7, only planar shapes of a finger electrode 42a and a connection electrode 42c are schematically shown in order to clearly show planar shapes of the connection electrode 42c. Therefore, as shown in FIG. 4 or 6, the connection electrode 42c may be formed first and the finger electrode 42a may be formed thereon, or the finger electrode 42a may be formed first and the connection electrode 42c may be formed thereon. This may be applied to embodiments shown in FIGS. 8 to 10 as it is.

For example, as shown in (a) of FIG. 7, a connection electrode 42c may include a plurality of inclined portions inclined to a finger electrode 42a in one direction and a plurality of other inclined portions inclined to a finger electrode 42a in another direction different from the one direction. The plurality of inclined portions and the plurality of other inclined portions may be alternately formed. Thus, it is exemplified that the connection electrode 42c has a zigzag shape. In (a) of FIG. 7, as an example, it is exemplified that the connection electrode 42c extends continuously from one end of the finger electrode 42a to the other end of the finger electrodes, and then, extends continuously from the other end of the finger electrode 42a to the one end of the finger electrode 42a again.

As another example, as shown in (b) of FIG. 7, a plurality of connection electrodes 42c, each having a zigzag shape, may be provided in a direction parallel to a minor axis.

As still another example, as shown in (c) of FIG. 7, inclined portions inclined in one direction inclined to a finger electrode 42a and other inclined portions inclined another direction inclined to the finger electrode 42a and different from the one direction are overlapped with each other, and thus, the connection electrode 42c has a shape in which diamond or rhombus shapes are continuously formed.

Figure 8:
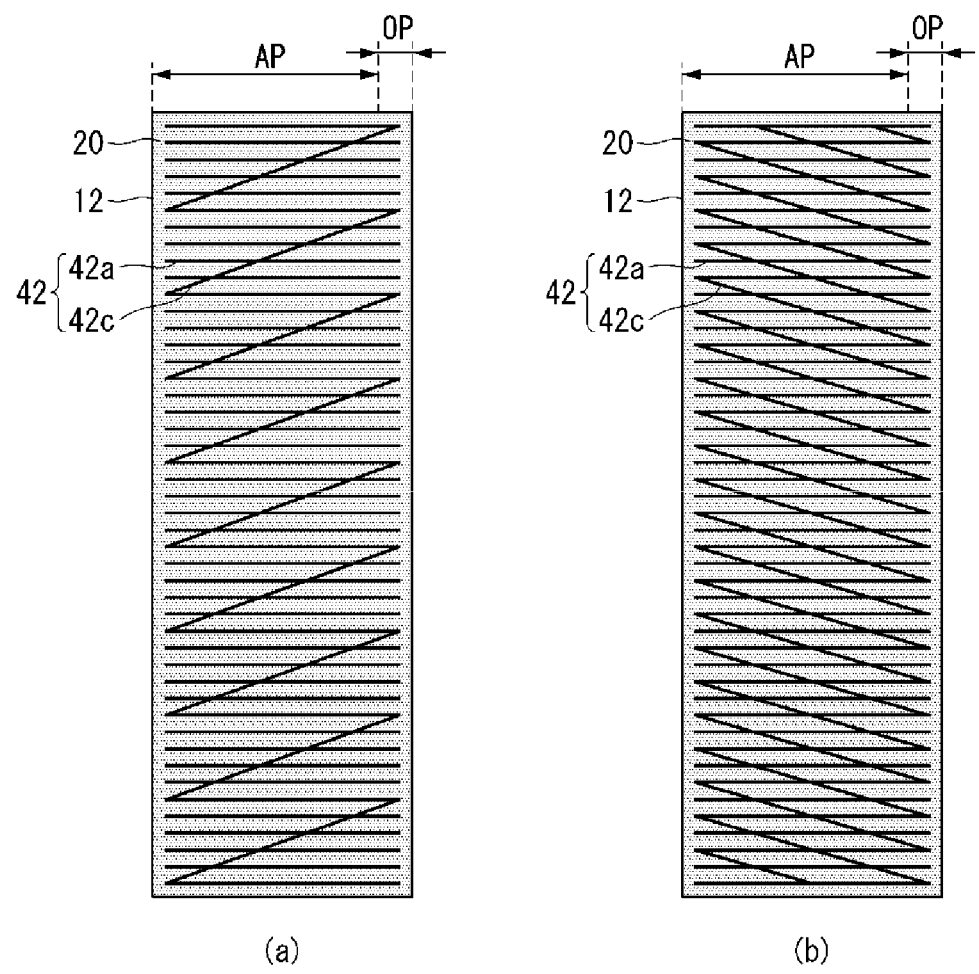
FIG. 8 is front plan views schematically showing solar cells according to other various modified embodiments of the invention.

FIG. 8 is front plan views schematically showing solar cells according to other various modified embodiments of the invention.

For example, as shown in (a) and (b) of FIG. 8, a connection electrode 42c may include a plurality of portions which are inclined to the finger electrode 42a in one direction and are parallel to each other. According to this, the connection electrode 42c can be evenly or uniformly distributed to the finger electrode 42a in a direction parallel to a minor axis direction without increasing an area of the connection electrode 42c, thereby effectively forming a bypass path of carriers.

Figure 9:
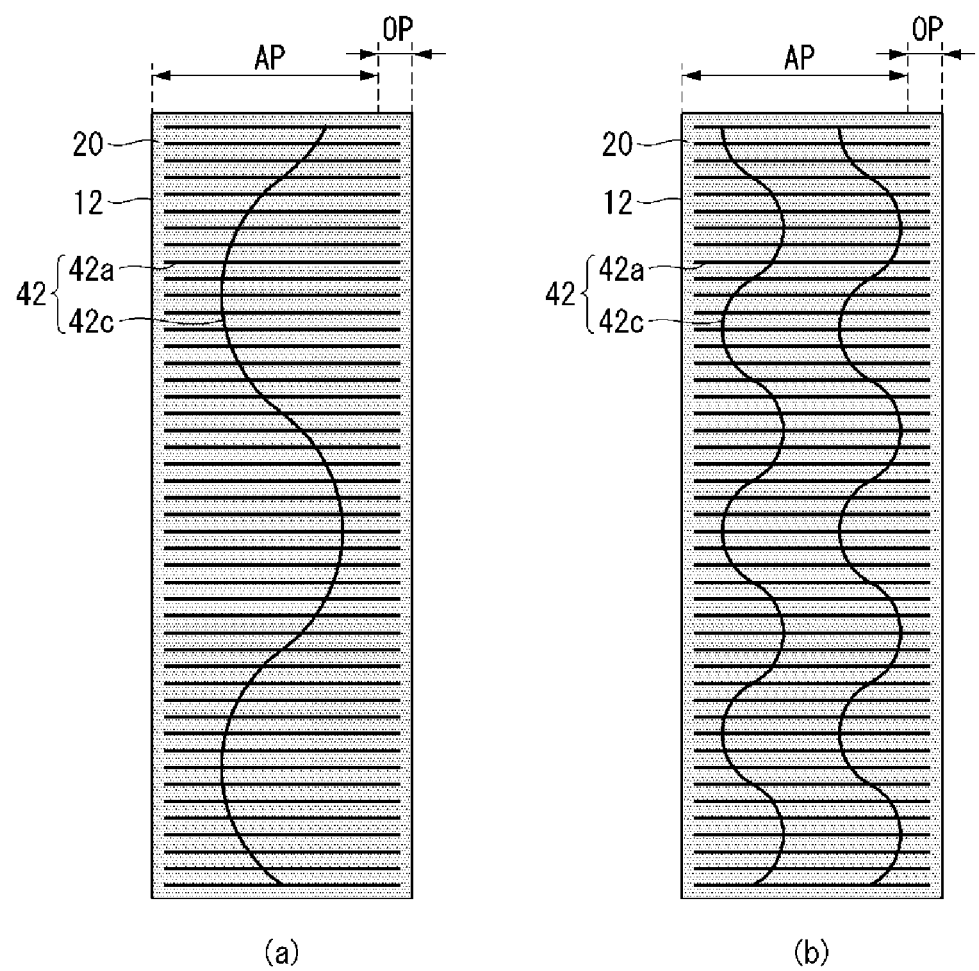
FIG. 9 is front plan views schematically showing solar cells according to still other various modified embodiments of the invention.

FIG. 9 is front plan views schematically showing solar cells according to still other various modified embodiments of the invention.

For example, as shown in (a) of FIG. 9, a connection electrode 42c may have a rounded shape and extend in a direction crossing a finger electrode 42a. In one example, the connection electrode 42c has a concave shape and a convex shape in a direction parallel to a minor axis, and concave shapes and convex shapes may be repeated in a direction parallel to a major axis. In (a) of FIG. 9, it is exemplified that one connection electrode 42c is shown as an example. As another example, as shown in (b) of FIG. 9, a plurality of connection electrodes 42c, each having a shape in which concave shapes and convex shapes are repeated, may be provided in a direction parallel to a minor axis.

Figure 10:
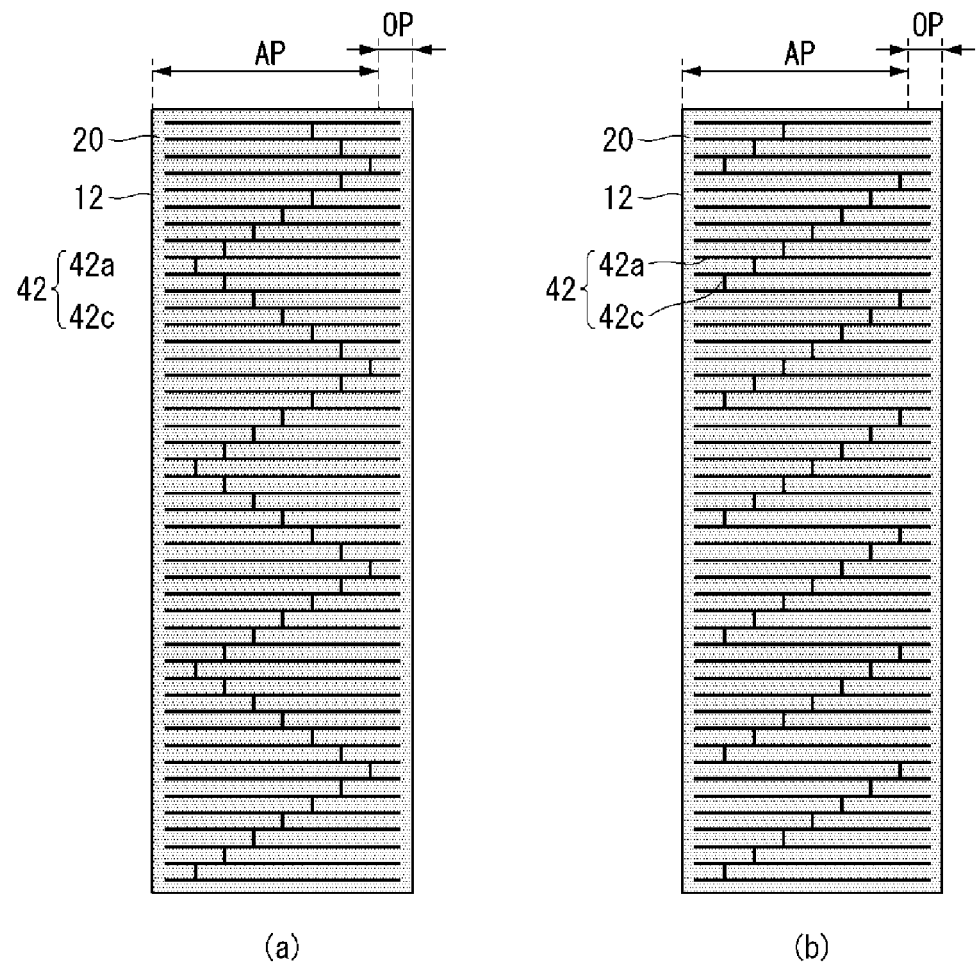
FIG. 10 is front plan views schematically showing solar cells according to still yet other various modified embodiments of the invention.

FIG. 10 is front plan views schematically showing solar cells according to still yet other various modified embodiments of the invention.

For example, as shown in (a) or (b) of FIG. 10, each of a plurality of connection electrodes 42c may connect only a part of a plurality of finger electrodes 42a, and the plurality of connection electrodes 42c may be positioned at different positioned in a direction parallel to a minor axis. A plurality of connection electrodes 42c are arranged to form a zigzag shape in (a) of FIG. 10, and a plurality of connection electrodes 42c are arranged to be parallel each other and extend in a direction inclined to a first direction. Accordingly, the connection electrode 42c can be evenly or uniformly distributed to the finger electrode 42a in a direction parallel to the minor axis while minimizing an area of the connection electrode 42c, thereby effectively forming a bypass path of carriers.

According to the above embodiments, the same or similar shape repeatedly positioned in a direction parallel to a major axis can improve esthetics of an appearance. However, the modified embodiments shown in FIGS. 7 to 10 are provided as examples, and thus, various modifications are possible.

Figure 11:
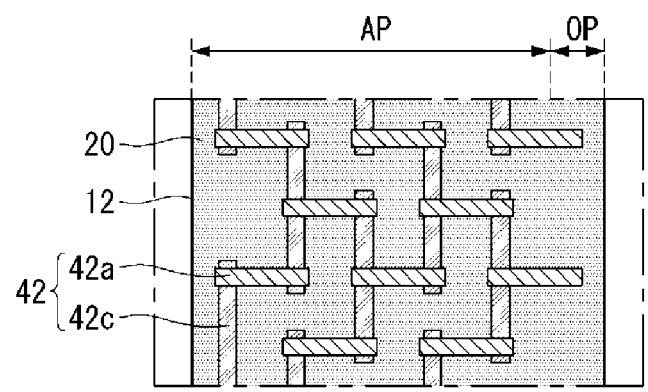
FIG. 11 is a partial front plan view schematically showing a solar cell included in a solar cell panel according to yet another embodiment of the invention.

FIG. 11 is a partial front plan view schematically showing a solar cell included in a solar cell panel according to yet another embodiment of the invention.

Referring to FIG. 11, in the embodiment, each of finger electrodes 42a extending in a first direction or a direction parallel to a minor axis includes a plurality of electrode portions spaced apart from each other in the direction parallel to the minor axis, and connection electrodes 42c connect the electrode portions of the finger electrodes 42a in a direction crossing the first direction. Then, an area of the finger electrodes 42a can be reduced, and thus, a carrier movement path can be stably secured by the connection electrode 42c without greatly increasing an area of the first electrode 42.

Figure 12:
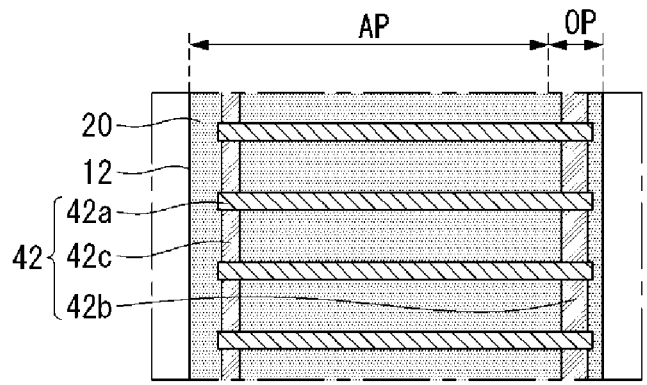
FIG. 12 is a partial front plan view schematically showing a solar cell included in a solar cell panel according to still another embodiment of the invention.

FIG. 12 is a partial front plan view schematically showing a solar cell included in a solar cell panel according to still another embodiment of the invention.

Referring to FIG. 12, in the embodiment, a connecting portion (e.g., a bus bar electrode 42b) may be included. The base bar electrode 42b connects end portions of finger electrodes 42a positioned in a overlapped portion OP and longitudinally extends in a direction parallel to a major axis crossing (for example, perpendicular to) a direction parallel to a minor axis. The bus bar electrode 42b is positioned in the overlapped portion OP overlapping the other solar cell 10 and is a portion where a connecting member 142 (in FIG. 2) for connecting adjacent solar cells 10 is directly positioned. In this instance, a width of the bus bar electrode 42b may be greater than a width of the finger electrode 42a and/or a width of the connection electrode 42c, but embodiments of the invention are not limited thereto. Therefore, a width of the bus bar electrode 42b may be the same as or less than a width of the finger electrode 42a and/or a width of the connection electrode 42c. With such a structure, the connecting member 142 is attached or adhered to the bus bar electrode 42b when the solar cells 10 are connected, thereby sufficiently securing an carrier movement area.

In this instance, the bus bar electrode 42b may be positioned in the same layer as the connection electrode 42c (that is, between the finger electrode 42a and a first insulating layer) and may have a material or a composition which is different from that of the finger electrode 42a and is the same as that of the connection electrode 42c. That is, the bus bar electrode 42b may not be in contact with the first conductive region 20 as a non-contact electrode. Then, a contact area with the connecting member 142 can be sufficiently secured by the bus bar electrode 42b, and also, a passivation property can be excellent without being deteriorated since a contact area between the first electrode 42 and the first conductive region 20 is not increased. In addition, the connection electrode 42c and the bus bar electrode 42b may be formed simultaneously by the same process, thereby simplifying a manufacturing process. However, embodiments of the invention are not limited thereto. Therefore, the bus bar electrode 42b may be formed of a material the same as a material of the finger electrode 42a in the same layer as the finger electrode 42a. Alternatively, the bus bar electrode 42b may have a material or a composition different from that of each of the finger electrode 42a and the connection electrode 42c, and/or the bus bar electrode 42b may be formed on a layer different from a layer on which the finger electrode 42a and the connection electrode 42c is formed. Various other variations are possible.

Figure 13:
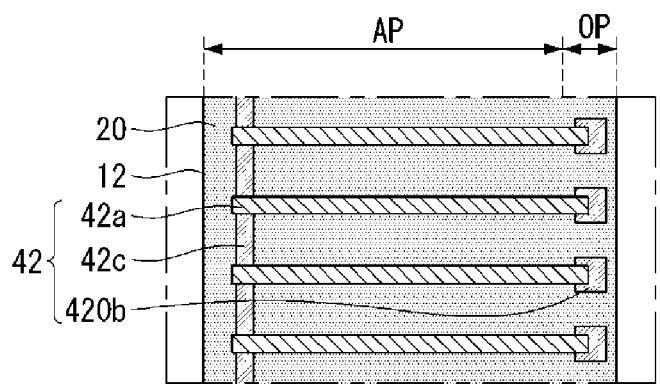
FIG. 13 is a partial front plan view schematically showing a solar cell included in a solar cell panel according to yet still another embodiment of the invention.

FIG. 13 is a partial front plan view schematically showing a solar cell included in a solar cell panel according to yet still another embodiment of the invention.

Referring to FIG. 13, in the embodiment, a connecting portion (e.g., a pad portion 420b) may be formed at an end of each finger electrode 42a in an overlapped portion OP. The pad portion 420b may have a length in a direction parallel to a major direction greater than a width of the finger electrode 42a in the direction parallel to the major direction. The pad portions 420b corresponding to the finger electrodes 42a may be spaced apart from each other.

With such a structure, the connecting member 142 is attached or adhered to the pad portion 420b when the solar cells 10 are connected, thereby sufficiently securing an carrier movement area. The connecting member 142 may include a first connection portion 142a (in FIG. 5) being in contact with the pad portion 420b and/or the finger electrode 42a and a second connection portion 142b (in FIG. 5) positioned between the pad portions 420b on a first insulating layer. An adhesive property by the connecting member 142 can be improved by the second portion 142b.

Figure 14:
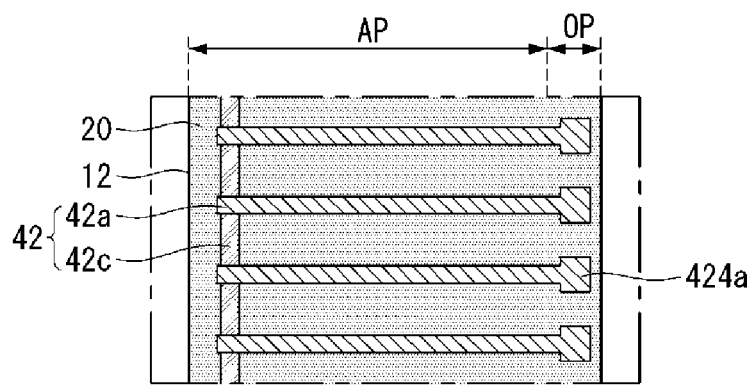
FIG. 14 is a partial front plan view schematically showing a solar cell according to another modified embodiment of FIG. 13.

In this instance, the pad portion 420b may be positioned on the same layer as the connection electrode 42c (that is, between the finger electrode 42a and the first insulating layer) and may have a material or a composition which is different from that of the finger electrode 42a and is the same as that of the connection electrode 42c. That is, the pad portion 420b may not be in contact with a first conductive region 20 as a non-contact electrode. Then, a contact area with the connecting member 142 can be sufficiently secured by the pad portion 420b, and also, a passivation property can be excellent without being deteriorated since a contact area between the first electrode 42 and the first conductive region 20 is not increased. In addition, the connection electrode 42c and the pad portion 420b may be formed simultaneously by the same process, thereby simplifying a manufacturing process. However, embodiments of the invention are not limited thereto. For example, the pad portion 420b may have a material or a composition different from that of each of the finger electrode 42a and the connection electrode 42c, and/or the pad portion 420b may be formed on a layer different from a layer on which the finger electrode 42a and the connection electrode 42c are formed. As another example, as shown in FIG. 14, a finger electrode 42a may include a pad portion 424a at an end positioned in an overlapped portion OP. In this instance, since the pad portion 424a constitutes a part of the finger electrode 42a, the pad portion 424a may be formed of the same material as the finger electrode 42a on a layer (that is, on a first conductive region 20) the same as a layer on which the finger electrode 42a is formed. Various other variations are possible.

Figure 15:
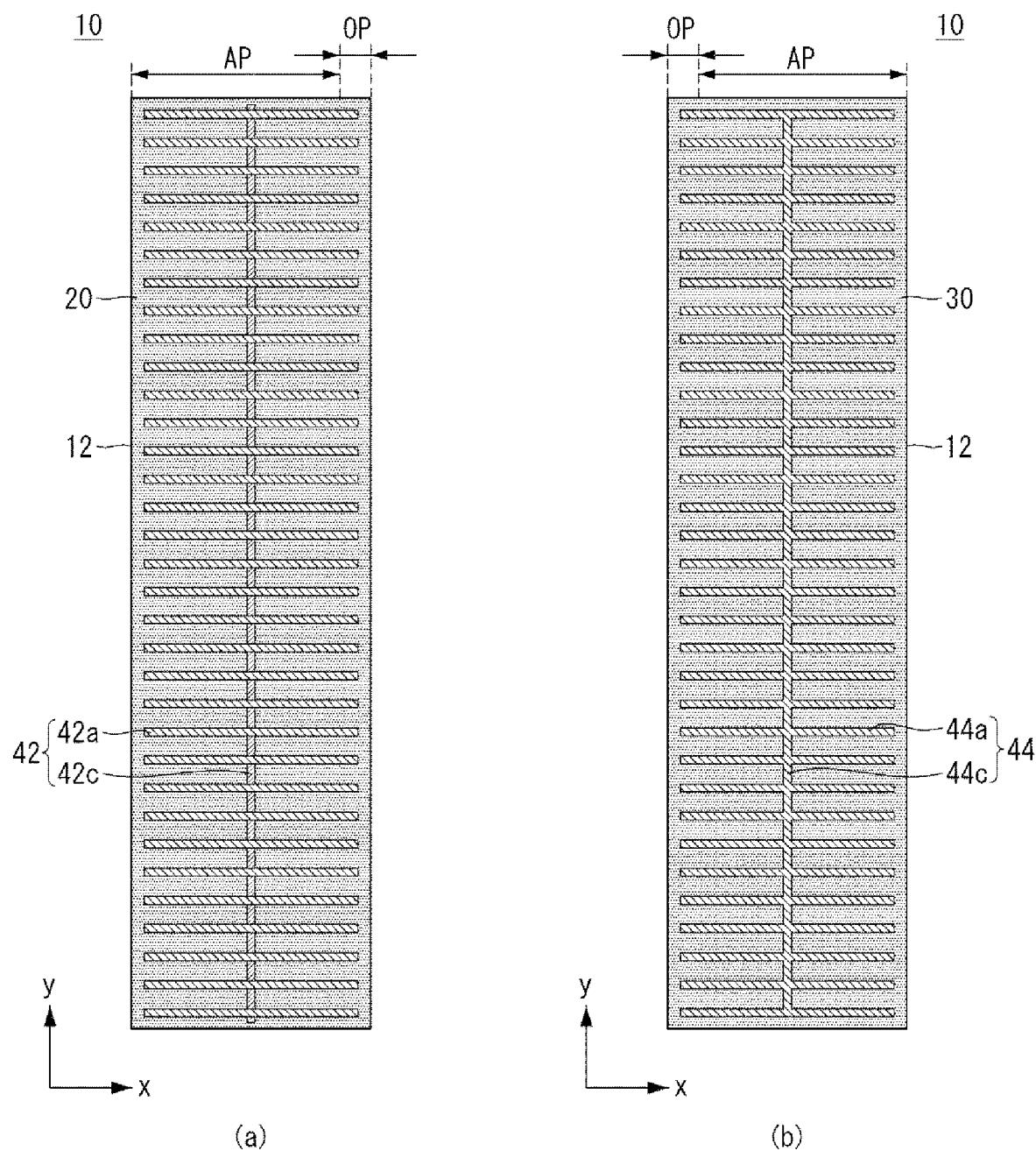
FIG. 15 is a front plan view and a rear plan view showing a solar cell included in a solar cell panel according to yet still another embodiment of the invention.

FIG. 15 is a front plan view and a rear plan view showing a solar cell included in a solar cell panel according to yet still another embodiment of the invention.

Referring to FIG. 15, in the embodiment, a connection electrode 42c of a first electrode 42 extends while penetrating or crossing inner portions of a plurality of finger electrodes 42a to connect the inner portions of the finger electrodes 42a, not end portions of the finger electrodes 42a. Similarly, a connection electrode 44c of a second electrode 44 extends while penetrating or crossing inner portions of a plurality of finger electrodes 44a to connect the inner portions of the finger electrodes 44a, not end portions of the finger electrodes 44a. That is, the connection electrodes 42c and 44c may cross the inner portions of the finger electrodes 42a and 44a spaced apart from both ends of the finger electrodes 42a and 44a in a first direction (an x-axis direction in FIG. 15). An average movement distance of carriers can be minimized when the connection electrodes 42c and 44c are formed to cross the inner portions of the finger electrodes 42a and 44a.

In FIG. 15 and the detailed description thereof, it is exemplified that the connection electrodes 42c and 42c of the first and second electrodes 42 and 44 have the same or very similar arrangement, but embodiments of the invention are not limited thereto. Accordingly, a shape, arrangement, and the like of the connection electrodes 42c and 44c of the first and second electrodes 42 and 44 may be different from each other. For example, the structures shown in FIG. 4, FIG. 6 to FIG. 14, etc. may be combined with each other, one of which may be applied to one of the first and second electrodes 42 and 44 and the other of which may be applied to the other of the first and second electrodes 42 and 44. Various other variations are possible.

Figure 16:
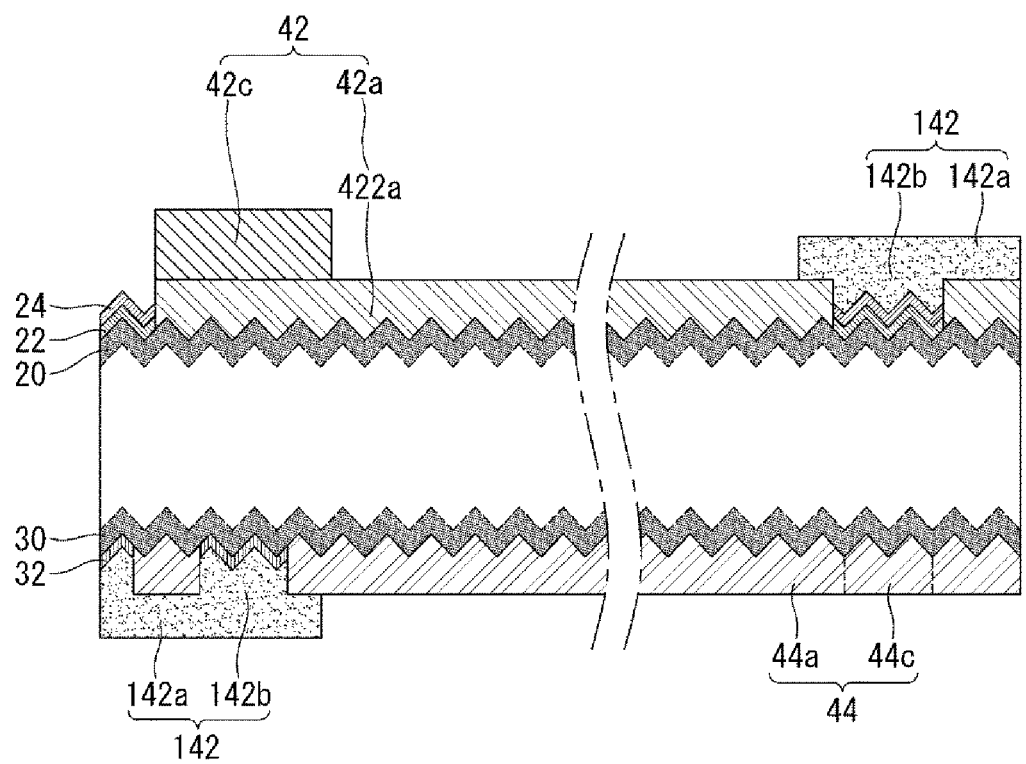
FIG. 16 is a cross-sectional view of a solar cell included in a solar cell panel according to yet still another embodiment of the invention.

FIG. 16 is a cross-sectional view of a solar cell included in a solar cell panel according to yet still another embodiment of the invention.

Referring to FIG. 16, in the embodiment, after a finger electrode 42a of a first electrode 42 is formed, a connection electrode 42c is formed on the finger electrode 42a of the first electrode 42. Accordingly, the finger electrode 42a may be entirely formed of a contact portion 422a which contacts a first conductive region 20 directly. Thus, the carriers generated by photoelectric conversion can be effectively collected from the first conductive region 20.

As shown in FIG. 16, at a portion where the finger electrode 42a is disposed, the connection electrode 42c may be positioned on (e.g., in contact with) the finger electrode 42a. Then, the connection electrode 42c may be spaced apart from a first insulating layer (a first passivation layer 22 and/or an anti-reflection layer 24) by the finger electrode 42a positioned between the connection electrode 42c and the first insulating layer. At a portion where the finger electrode 42a is not disposed, the connection electrode 42c may be positioned on (e.g., in contact with) the first insulating layer. Accordingly, when viewed in a second direction (a y-axis direction in the drawings), the connection electrode 42c may alternately include a portion positioned on the finger electrode 42a and a portion positioned on the first insulating layer. Other variations are possible.

Although the first electrode 42 is mainly shown in FIG. 16 and described the description thereof, the structure of the first electrode 42 may be applied to a second electrode 44 in the case where a finger electrode 44a and a connection electrode 44c of the second electrode 44 are formed as separate layers. That is, the connection electrode 44c of the second electrode 44 may be positioned on the finger electrode 44a of the second electrode 44. Alternatively, the finger electrode 44a may be positioned on the connection electrode 44c of the second electrode 44.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:

1. A solar cell panel, comprising:
a plurality of solar cells comprising a first solar cell and a second solar cell, wherein an overlapped portion of the first solar cell overlaps with an overlapped portion of the second solar cell; and
a connecting member that is located between the overlapped portion of the first solar cell and the overlapped portion of the second solar cell and that connects the first solar cell to the second solar cell,
wherein at least one of the first solar cell or the second solar cell comprises:
a semiconductor substrate that has a length in a first direction and a width in a second direction, the second direction being different from the first direction,
a first conductive region that is coupled to the semiconductor substrate, and
a first electrode that is electrically connected to the first conductive region,
wherein the first electrode of the first solar cell comprises:
a plurality of finger electrodes that extend in the first direction, and
a connection electrode that extends in the second direction, that electrically connects two or more of the plurality of finger electrodes to each other, and that is separated from the first conductive region,
wherein two adjacent finger electrodes of the plurality of finger electrodes are separated from each other,
wherein a portion of the connection electrode is located at a space between the two adjacent finger electrodes of the plurality of finger electrodes,
wherein the connecting member includes (i) a plurality of first connecting portions that are respectively connected to the plurality of finger electrodes and (ii) a plurality of second connecting portions that are coupled to an insulating layer, the insulating layer being located at the space between the two adjacent finger electrodes of the plurality of finger electrodes, and
wherein the plurality of first connecting portions and the plurality of second connecting portions are alternately arranged in the second direction.

2. The solar cell panel of claim 1, wherein the plurality of finger electrodes comprise respective contact portions that are directly in contact with the first conductive region.

3. The solar cell panel of claim 1, wherein at least one portion of the connection electrode is located at a non-overlapped portion of the first solar cell.

4. The solar cell panel of claim 3, wherein the overlapped portion of the first solar cell is located at a first side of the first solar cell, and wherein a portion of the connection electrode of the first solar cell is located at a second side of the first solar cell, the first side being opposite to the second side relative to a center of the first solar cell.

5. The solar cell panel of claim 4, wherein the connection electrode extends in the second direction and is respectively connected to the plurality of finger electrodes, the connected portions of the plurality of finger electrodes being located at the second side of the first solar cell.

6. The solar cell panel of claim 1, wherein at least one portion of each of the plurality of finger electrodes is located on a surface of the connection electrode.

7. The solar cell panel of claim 6, wherein at least one of the plurality of finger electrodes comprises:
  a contact portion that is directly in contact with the first conductive region and that does not overlap with the connection electrode, and
  a non-contact portion that is separated from the first conductive region and that overlaps with the connection electrode, wherein the connection electrode is located between the non-contact portion and the first conductive region.

8. The solar cell panel of claim 1, wherein a width of the connection electrode is five times or less than a width of at least one of the plurality of finger electrodes.

9. The solar cell panel of claim 1, wherein a thickness of the connection electrode is less than or equal to a thickness of at least one of the plurality of finger electrodes.

10. The solar cell panel of claim 1, wherein both the connection electrode and the plurality of finger electrodes include a particular conductive material, and
  wherein a glass frit of the connection electrode is different from a glass frit of the plurality of finger electrodes.

11. The solar cell panel of claim 1, wherein the first solar cell comprises:
  a connecting portion that is electrically connected to an end of at least one of the plurality of finger electrodes and that has a length greater than a width of the at least one of the plurality of finger electrodes in the second direction, the end being located at the overlapped portion of the first solar cell.

12. The solar cell panel of claim 1, wherein the first solar cell comprises:
  a second conductive region that is coupled to the semiconductor substrate, and
  a second electrode that is electrically connected to the second conductive region,
  wherein a surface of the second electrode is entirely in contact with the second conductive region.

\* \* \* \* \*